United States Patent [19]
Laser

[11] Patent Number: 5,625,185
[45] Date of Patent: Apr. 29, 1997

[54] MASS SPECTROMETER, ESPECIALLY ICP-MS

[75] Inventor: Bernd Laser, Stuhr, Germany

[73] Assignee: Finnigan Mat GmbH, Bremen, Germany

[21] Appl. No.: 532,456

[22] Filed: Sep. 22, 1995

[30] Foreign Application Priority Data

Sep. 22, 1994 [DE] Germany ............... 44 33 807.4

[51] Int. Cl.$^6$ ............... H01J 49/02; G01N 27/62; B01J 19/02
[52] U.S. Cl. ............... 250/288; 250/281
[58] Field of Search ............... 250/288, 281

[56] References Cited

U.S. PATENT DOCUMENTS

| | | | |
|---|---|---|---|
| 5,191,212 | 3/1993 | Falk et al. | 250/288 |
| 5,223,711 | 6/1993 | Sanderson et al. | 250/281 |

FOREIGN PATENT DOCUMENTS 2099216  12/1982  United Kingdom.

OTHER PUBLICATIONS

German Patent Office Action re Application No. P 44 33 807.4–33.

Search Report re GB Application No. 9519372.8.

Bello et al., Nuclear Instruments and Methods in Physics Research, B80/81 (1993), pp. 1002–1005.

*Primary Examiner*—Jack I. Berman
*Attorney, Agent, or Firm*—Flehr Hohbach Test Albritton & Herbert A CA LLP

[57]  ABSTRACT

In mass spectrometers with a plasma ion source (ICP-MS), a high ion current takes effect on the entrance of the ion optical system. The components provided there, especially lenses and apertures, have hitherto been made of steel. Atoms and ions are released from the surface of the components by a sputtering effect. This results in a correspondingly spoiling background signal and in losses in the quality of the analysis. To avoid the described effects, the components which are subjected to ion bombardment are made of graphite. The sputter rate and the ion yield of the carbon are much lower than those of steel (iron, nickel and chromium).

8 Claims, 2 Drawing Sheets

MASS SPECTROMETER, ESPECIALLY ICP-MS

BACKGROUND OF THE INVENTION

On its way to the detector, the ion beam of an ion source passes a number of components whose design decisively influence the quality of the analysis by mass spectrometry. The so-called ion optical components for the guidance, the focusing and, if appropriate, the acceleration of the ion beam are of particular importance. Hitherto, aperture and lens systems made of steel have been used. A disadvantage of the material steel is that atoms and ions are released which, under unfavorable circumstances, are detected and interfere with the ions to be analyzed, or spoil their signals. The release of atoms and ions from a surface as a result of bombardment is also known as sputtering effect.

It is of crucial importance to avoid the sputtering effect in high resolution mass spectrometers in connection with an ICP-plasma ion source or an API ion source (ICP=Inductive Coupled Plasma, API=Atmospheric Pressure Ionization). At the exit of the ion source there is a very high ion current. The source itself is normally operated at atmospheric pressure. The inert gas, for example argon, used for the generation of the plasma can flow into the ion optical system in ionized form via an intermediate interface. A pressure reduction occurs over a plurality of stages until a high vacuum is reached, but there is a relatively high current of argon ions at the entrance of the ion optical system which favors the sputtering effect on the components of the ion optical system. The same applies to all other components that are subjected to the ion current, e.g. the sampler and the skimmer of the interface near the exit of the ion source.

OBJECT AND SUMMARY OF THE INVENTION

The object of the present invention is to avoid or reduce the described sputtering effect.

According to the invention, the object is attained in that the components which are subjected to ion bombardment are made of carbon, or have a carbon-containing surface. Carbon, especially in the form of graphite or electrographite, can be processed by turning, milling, and grinding. In this manner, lenses or apertures for ion optical system can be produced from graphite blanks in a simple way. It is also possible to apply a carbon coating onto other materials.

Experiments have shown that carbon reacts much more inertly or passively under ion bombardment than iron, nickel, and chromium of the hitherto used steels. Only very few carbon atoms are released by the ion bombardment. The yield of secondary ions is also much less than in the other mentioned elements. By using the material carbon, the background signals of the previously used materials taking effect on the detector are removed. A measurable background signal of the carbon is not present, because the sputter rate and the ion yield of the carbon are substantively smaller than those of the hitherto used materials. The invention positively affects the detect on limit of the mass spectrometer.

The invention is particularly advantageous for ion lenses which are subjected to ions with more than 100 eV energy, and in conjunction with special ion sources, as for example ICP, API or glow-discharge sources. Preferably the first (of a plurality) of accelerating lenses is made of graphite. Of course, the invention does not just cover a mass spectrometer with components made of carbon, but also the design of ion optical components alone—for being used in mass spectrometers—made of carbon or with a substantially carbon-containing surface.

DETAILED DESCRIPTION OF THE PREFERRED EMBODIMENT

Figure 1:
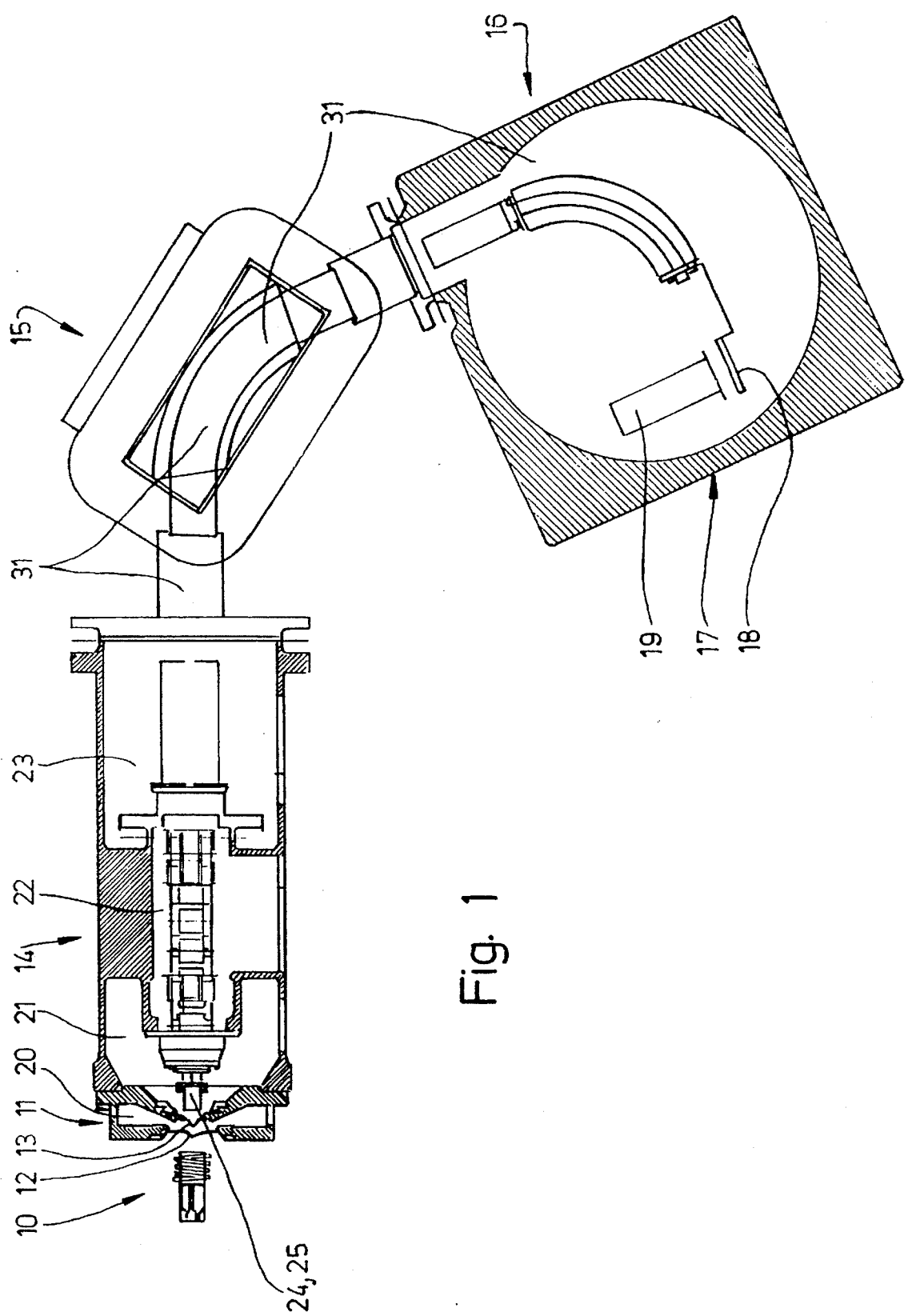
FIG. 1 shows an overall view of a mass spectrometer with a plasma ion source (ICP), partly in a section taken along the ion trajectory.

The exemplary embodiment relates to a mass spectrometer with an ICP ion source 10 on the left hand side of FIG. 1. In the direction of the ion trajectory and downstream of the ion source are arranged a plasma interface 11 with a sampler 12 and a skimmer 13, an ion optical system 14 for guiding, focusing and accelerating the ions with lenses and apertures provided for this purpose, a magnetic sector 15, an electric sector 16, and an ion detector 17 with a conversion dynode 18 and a secondary-electron multiplier 19. Different pressure stages are set up in the region of the plasma interface 11 and the ion optical system 14. Four separated chamber 20 to 23 and a further downstream chamber 31 are shown, from which the molecules and the atoms are respectively pumped out. In the chambers 21 to 31 there is a high vacuum. The quality of the high vacuum increases with the distance from the skimmer 13. In the chamber 11, there is a prevacuum, whereas, in the region of the ion source 10, there is approximately atmospheric pressure. In the ion source 10, an argon plasma is produced by high-frequency induction. Argon ions, together with the ions to be analyzed, enter into the ion optical system via the plasma interface 11, and are focused therein and accelerated until they enter into the mass analyzer (magnetic and electric sector). In the present case, a further particularity is that the ion source is grounded and the analyzer is under high voltage. Accordingly, a part of the ion optical system is under high voltage, whereas the plasma interface, as well as the ion source 10, have ground potential.

Figure 2:
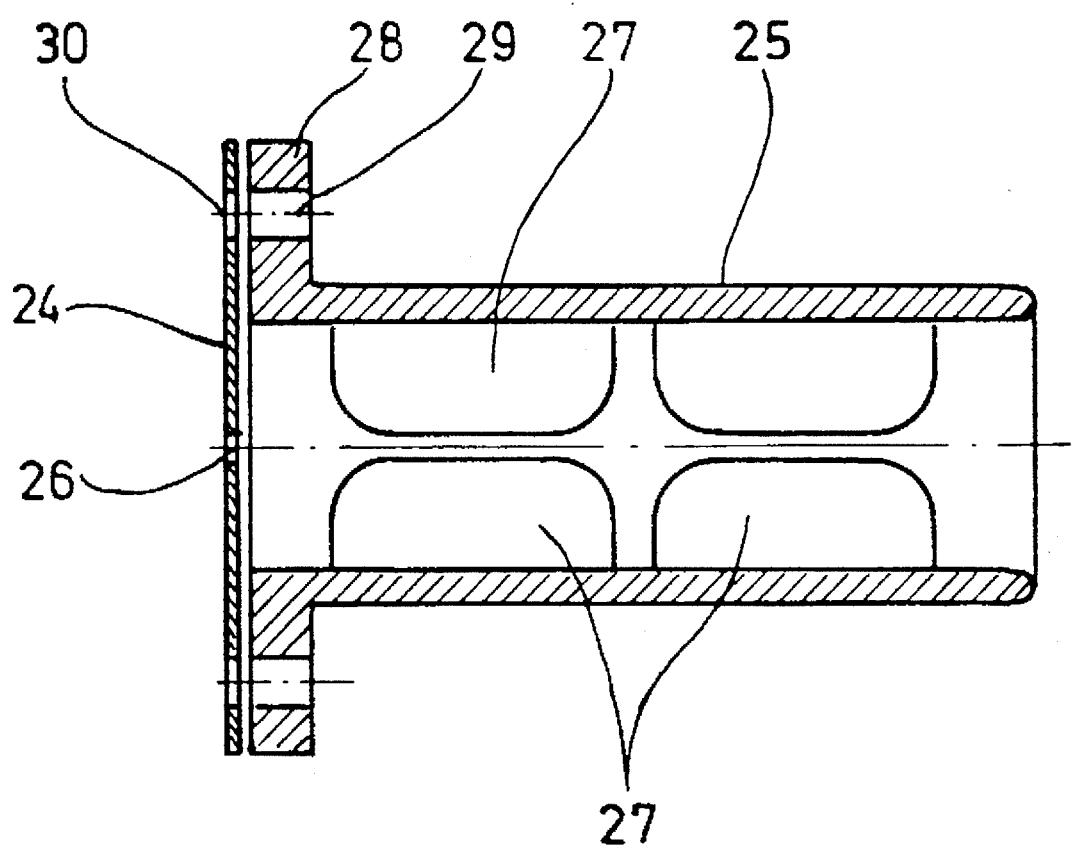
FIG. 2 shows components of an ion optical system according to FIG. 1, and in a section taken along the ion trajectory.

The ion current passing the plasma interface 11 and the ion optical system 14 is relatively high. The components to be passed are especially subjected to an intense bombardment with argon ions. At the entrance of the ion optical system 14, in the region of the chamber 21, i.e. downstream of the skimmer 13, are located an aperture 24 and a following lens 25 (FIG. 2). The aperture 24 serves for the separation of the chamber 22 from the chamber 21, and is provided with a small hole 26 for the passage of the ions to be analyzed. The lens 25 has a defined electric potential and serves for the acceleration and focusing of the ion beam. The tubular shape of the lens 25 is interrupted by openings 27 located one behind another in the longitudinal direction (direction of the ion beam) and in the peripheral direction, for pumping out free molecules. Furthermore, the lens 25 is provided, at the end that faces the aperture 24, with a flange 28 for the connection with the aperture 24. A corresponding screw connection or rivet connection is not shown, merely connecting bores 29 (flange), 30 (aperture).

The lens 25 and the aperture 24 are not, as usual heretofore, made from steel, but consist of graphite. In the present case, they are made of highly pure electrographite, as for example processed by the company Schunk Kohlenstofftechnik, Giessen (Germany) and referred to as FP 779. The material should have a dust fraction which is as low as possible, and as little foreign atoms as possible. As a consequence, the results of the analysis of the mass spectrometer are of correspondingly higher quality.

Apart from the mentioned components, further components being subjected to ion bombardment may be made of graphite, for example the sampler 12 and the skimmer 13. Furthermore, the components may have a carbon coating and consists of a different material otherwise.

Furthermore, the invention is not restricted to being applied in connection with an ICP-MS. The invention may also be applied advantageously in connection with other mass spectrometers or ion sources, for example in connection with an API ion source.

I claim:

1. A mass spectrometer, of the ICP (inductively coupled plasma) or API (atmospheric pressure ionization) type with an ion source (10) at substantially atmospheric pressure, an ion optical system (14) and mass analyzer at a high vacuum and an interface (11) between such ion source and ion optical system at an intermediate pressure, the interface (11) being provided with a chamber (20) having a sampler (12) facing toward the ion source and a skimmer (13) facing toward the ion optical system, characterized in that at least one of the sampler (12) or the skimmer (13) or both have at least a surface made from carbon.

2. A mass spectrometer as in claim 1 where said ion optical system (14) includes a high vacuum first chamber (21) downstream of said skimmer and toward said mass analyzer containing an aperture (24) and a lens (25) where at least one of said lens or aperture has at least a surface made from carbon.

3. A mass spectrometer as claimed in claim 1 wherein the carbon is electrographite.

4. A mass spectrometer as claimed in claim 2 wherein the electrographite is highly pure with a maximum ash content of 0.001%.

5. A mass spectrometer as in claim 1 characterized in that the ion optical system (14) is provided with a plurality of separate chambers or pressure stages with pressures reducing from the interface (11) towards the mass analyzer and wherein said first chamber (21), which is the initial pressure stage, is a high vacuum.

6. A mass spectrometer as in claim 1 characterized in that the ion optical system (14) is followed by a magnetic sector (15) and an electric sector (16) of the mass analyzer.

7. A mass spectrometer as in claim 1 characterized in that the ion source and interface (11) or the sampler (12) are grounded and said mass analyzer is under a high voltage.

8. A mass spectrometer as in claim 1 where both said sampler (12) and skimmer (13) have at least a surface made from carbon said optical system (14) including an aperture (24) and a lens (25) both having at least a surface made from carbon.

* * * * *